United States Patent [19]

Chung

[11] Patent Number: 5,579,827
[45] Date of Patent: Dec. 3, 1996

[54] HEAT SINK ARRANGEMENT FOR CENTRAL PROCESSING UNIT

[75] Inventor: Hao S. Chung, Monterey Park, Calif.

[73] Assignee: US Micro Lab, Inc., Monterey Park, Calif.

[21] Appl. No.: 556,600

[22] Filed: Nov. 13, 1995

[51] Int. Cl.$^6$ ....................................................... F28F 7/00
[52] U.S. Cl. ...................... 165/80.3; 165/121; 165/185; 174/16.3; 257/719; 257/722; 361/697; 361/704
[58] Field of Search .................................. 165/80.2, 80.3, 165/121, 185; 174/16.3; 257/718, 719, 722; 361/695, 697, 703, 704, 707, 709, 710

[56] References Cited

U.S. PATENT DOCUMENTS

| | | | |
|---|---|---|---|
| 4,345,267 | 8/1982 | Corman et al. | 257/719 |
| 4,396,935 | 8/1983 | Schuck | 257/722 X |
| 4,607,685 | 8/1986 | Mitchell, Jr. | 165/80.3 |
| 5,313,099 | 5/1994 | Tata et al. | 257/719 X |
| 5,353,193 | 10/1994 | Chia et al. | 361/704 |

FOREIGN PATENT DOCUMENTS

| | | | |
|---|---|---|---|
| 254360 | 9/1992 | Japan | 257/722 |

*Primary Examiner*—Leonard R. Leo
*Attorney, Agent, or Firm*—David & Raymond; Raymond Y. C. Chan

[57] ABSTRACT

A heat sink arrangement for securing a specific heat sink in thermal contact with a central processing unit. The heat sink arrangement comprises a CPU homing, a finned heat sink and a heat sink holding unit. The CPU housing includes a frame having a square central hole thereon, an securing ring extended upwardly and perpendicularly from the border fringe of the top surface of the frame and having an threaded periphery surface and an inner size larger than the size of the square hole, and a holding means provided underneath the frame for firmly gripping the CPU housing on a CPU. The heat sink has a finned cylindrical upper portion, a square lower portion and a circular supporting rim formed outwardly therebetween. The square lower portion of the heat sink is adapted for inserting into the square hole of the CPU housing for urging upon the top surface of the CPU. The heat sink holding trait has a threaded circular lower portion adapted to screwing onto said threaded periphery surface of the securing ring of the CPU housing, an upper portion having at least two opposite guard lips with inclined end surface protruded inwardly and horizontally from its inner surface, and a supporting ring protruded inwardly between the upper and lower portions so as to define a holding chamber between the guard lips and the supporting ring. The heat sink is firmly held in position by pushing the supporting rim of the heat sink down into the holding chamber with the inclined surfaces of the guard lips acting as guiding surfaces for disposing the supporting rim of the heat sink between the guard lips and the supporting ring.

19 Claims, 2 Drawing Sheets

HEAT SINK ARRANGEMENT FOR CENTRAL PROCESSING UNIT

BACKGROUND OF THE INVENTION

The present invention relates to apparatus for securing a heat sink to electronic device package such as central processing unit for dissipation of heat therefrom, and more particularly to heat sink arrangement for central processing unit (CPU) which firmly holds the heat sink and evenly urges it into engagement with the CPU in intimate thermal contact with the maximum thermal contact area.

The most common way to improve the package thermal performance is to increase the surface area of the device by attaching a large piece of metal, a heat sink, to the package. The heat sink is usually made of Aluminum or Copper and is chosen for its price and thermal performance ratio.

Finned heat sinks have been found to be particularly effective when placed in contact with an electronic device package, such as a central processing unit (CPU), a microprocessor or a gate array, for transferring heat through conduction from the CPU and rapidly dissipating such heat to the environment by the enlarged surface area provided by the fins. Various heat sink assemblies are known in the art to thermally couple heat sinks with such CPU so as to dissipate heat generated by the CPU and thus lower the temperature of the CPU to safe limits.

It is known to use gripping assembly to hold a heat sink to a CPU, examples of such heat sink gripping assembly are shown and described in U.S. Pat. Nos. 4,745,456; 5,251,101; 5,423,375; 5,409,352; and 5,353,863. Such gripping structure is difficult to hold the heat sink in intimate thermal contact with the CPU due to uneven clamping force. In fact, clearance may easily be formed between the heat sink and the CPU which may significantly reduce the thermal coupling. Such gripping structure, while effective when the clamping force biases the heat sink into firm engagement with the CPU, such structure tends to be inconsistent as the CPU heats up and, at elevated temperatures, the force biasing the heat sink against the CPU can decrease making the thermal path less efficient.

Another known example of heat sink assembly is disclosed in U.S. Pat. No. 5,313,099. This patent provides a heat sink assembly adapted for removing heat from an electronic device package comprises an adaptor and a heat sink. The adaptor has a top wall and a pair of opposed side walls depending downwardly therefrom, in which a groove formed in each side wall extending generally parallel to the top wall in alignment with and facing each other and being capable of slidably receiving said electronic device package. The adaptor further has a first and a second planes lying respectively in the top and bottom of the grooves defining a space therebetween. The groove is adapted to dampingly receive opposite marginal portions of an electronic device package when inserted therein. The top wall has a bore centrally located and extended therethrough. The heat sink has a cylindrical base member with a flat bottom surface adapted to be received through the bore in the top wall. The base member formed with means to engage with the periphery thread of the bore to secure and to attach the heat sink member to the adaptor with the flat bottom surface disposed in the space between the first and second planes whereby an electronic device package slidably inserted in the grooves will cause the top wall to bow through engagement with the flat bottom surface of the base.

In accordance with a preferred first embodiment of U.S. Pat. No. 5,313,099, the bore is a threaded bore and the base member of the heat sink is provided with outer thread. The heat sink is screwed to the threaded bore and down toward the electronic device package until the flat bottom surface of the heat sink base member is firmly biased against the top of the electronic device package and thermally coupled thereto. According to another preferred embodiment, the base member is provided with an outwardly extending flange at its lower distal end and is provided with a tapered surface portion. The flange is adapted to snap through the bore in the top wall to lock the heat sink to the adaptor.

The flange structure of the base member according to the second embodiment has the following disadvantages. If the urging force applied to the top surface of the electronic device package by the base member is insufficient where the thickness of the base member is thinner than the thickness of the bore, it is found that the thermal coupling can be significantly reduced and thus increase the thermal resistance therebetween. If the urging force applied to the top surface of the electrode device package by the base member where the base member's thickness is larger than the bore's thickness, the overloaded urging force may damage the electrode device package. Hence the flange structure of the heat sink base member mentioned above is messy, tedious, labor intensive and therefore expensive and it is difficult to accurately manufacture various parts with desired dimension.

The screwing engagement structure between the base member and the bore according to the first embodiment simplifies the coupling operation of the heat sink assembly but it bears some unexpected adverse effects. Since the threaded bore is formed on the top wall of the adaptor and the electrode device package is received between the first and second plane, the surface area of the bottom surface of the base member which is screwed to the threaded bore should be smaller than the surface area of the top surface of the electrode device package. Generally, the surface area of the top surface of the electrode device package, for example a Pentium Processor, is 25 sq. cm, i.e. 5 cm×5 cm, wherein the top surface area of its major heat generating central portion, integral circuit portion, is approximately 3.5 cm×3.5 cm, i.e. 12.25 sq.cm.

However, due to the limited space provided around the electronic device package for installment, the maximum exterior size of the adaptor is 5.3 cm×5.3 cm and thus the adaptable diameter of the base member of the heat sink is 2.7 cm. So that the bottom surface area of the base member is 5.72 sq. cm, i.e. 1.35 cm×1.35 cm×π. Accordingly, only a limited small central area of the top surface of the electrode device package is in thermal contact with the bottom surface of the heat sink base member. In fact, only 46.69% of the major heat generating central portion of the top surface or 22.89% of the entire top surface of the Pentium Processor is in thermal contact with the heat sink.

It is well known that to maximize the flow of heat for a given junction temperature rise over the ambient temperature, the thermal resistance from heat sink to air can be reduced by maximizing the surface area, and maximizing the airflow across the surface area. Therefore, the larger thermal contact area may result the better thermal conduction. Hence the best thermal conducting condition of the heat sink is at least entirely in thermal contact with the major heat generating central portion of the top surface of the Pentium Processor. Conversely, the conventional structure of directly screwing the heat sink via an adapter upon the CPU limits the thermal contact area merely to the a limited small central portion of the top surface of the CPU with the result that it reduces the heat dissipating effect of the heat sink.

Moreover, when the operator screws the base member of the conventional heat sink as mentioned above into the threaded bore and down toward the electronic device package until the flat bottom surface of the heat sink base member is firefly biased against the top of the electronic device package, a downward urging force is applied to the central contacting portion of the electronic device package. Since the outer marginal portions of the housing of electronic device package is gripped between the lips and the top wall of the adaptor, the outer marginal portions of the housing of electronic device package will apply an upward reaction force to the top wall. Thus a bending torque force is formed to the electronic device package which may cause deleterious operational effects and damage the package.

On the other hand, the electronic device package is held in position by supporting its side edges with the side lips of the adaptor. During operation, although the bottom surface of the heat sink base member is already in contact with the horizontally supported electronic device package, the operator is still able to continue the downward screwing of the heat sink by bending the package that may cause adverse effects to the package. Besides, such over screwing of the heat sink upon the electrode device package may cause the bottom surface of the base member scratching upon the top surface of the electronic device package, causing unexpected adverse effects.

SUMMARY OF THE INVENTION

The main object of the present invention is to provide a heat sink arrangement for central processing unit, in which the heat sink is able to in thermal contact with the major heat generating central area of the top surface area of the CPU that it maximizes the thermal contact area and thus results in maximizing intimate thermal conduction.

Another object of the present invention is to provide a heat sink arrangement for central processing unit wherein the downward urging force of the heat sink is evenly applied to the top surface of the CPU by means of a heat sink holding unit.

Another object of the present invention is to provide a heat sink arrangement for central processing unit, in which the heat sink is unable to move downward once it is in well thermal contact with the horizontally disposed CPU preventing any torque force applying upon the CPU that may cause bending and stress concentration of the CPU.

Another object of the present invention is to provide a heat sink arrangement for central processing unit, in which the downward motion of the heat sink driven is driven merely by the downward pressing of a heat sink holding unit provided by the present invention without any rotation, and thus the bottom surface of the heat sink where in contact with the CPU will not scrape against the top surface of the CPU.

Another object of the present invention is to provide a heat sink arrangement for central processing unit wherein its installing operation is easy, fast and firm.

Accordingly, the present invention provides a heat sink arrangement for securing a heat sink to a central processing unit, CPU, for dissipating of heat generated therefrom. The heat sink arrangement comprises a CPU housing, a finned heat sink and an heat sink holding unit. The CPU housing has a circular frame made of electrically insulating material such as nytron or delrin. The CPU housing includes a frame having a square central hole thereon, an securing ring extended upwardly and perpendicularly from a border fringe of a top surface of the frame and having an threaded periphery surface and an inner size larger than the size of the square hole, and a holding means provided underneath the frame for firmly gripping the CPU housing on the CPU.

The finned heat sink has a finned upper portion, a square lower portion having a transverse channel cavity, and a circular supporting rim formed therebetween. The square lower portion of the heat sink is adapted for inserting into the square hole of the CPU housing for urging upon the top surface of the CPU. The heat sink further has at least an axial airflow hole longitudinally penetrating through from the finned upper portion to the transverse channel cavity of the square lower portion.

The heat sink holding unit has a threaded circular surface positioned at a lower portion thereof adapted for screwing onto stud threaded periphery surface of the securing ring of the CPU housing, an upper portion having at least two opposite guard lips that each has an inclined end surface protruded inwardly and horizontally from its tuner surface, and a supporting ring protruded inwardly between the upper and lower portions so as to define a holding chamber between the guard lips and the supporting ring. The heat sink is firmly held in position by pushing the supporting rim of the heat sink down into the holding chamber with the inclined surfaces of the guard lips acting as guiding end surfaces for disposing the supporting rim of the heat sink between the guard lips and the supporting ring.

DETAILED DESCRIPTION OF THE INVENTION

Figure 1:
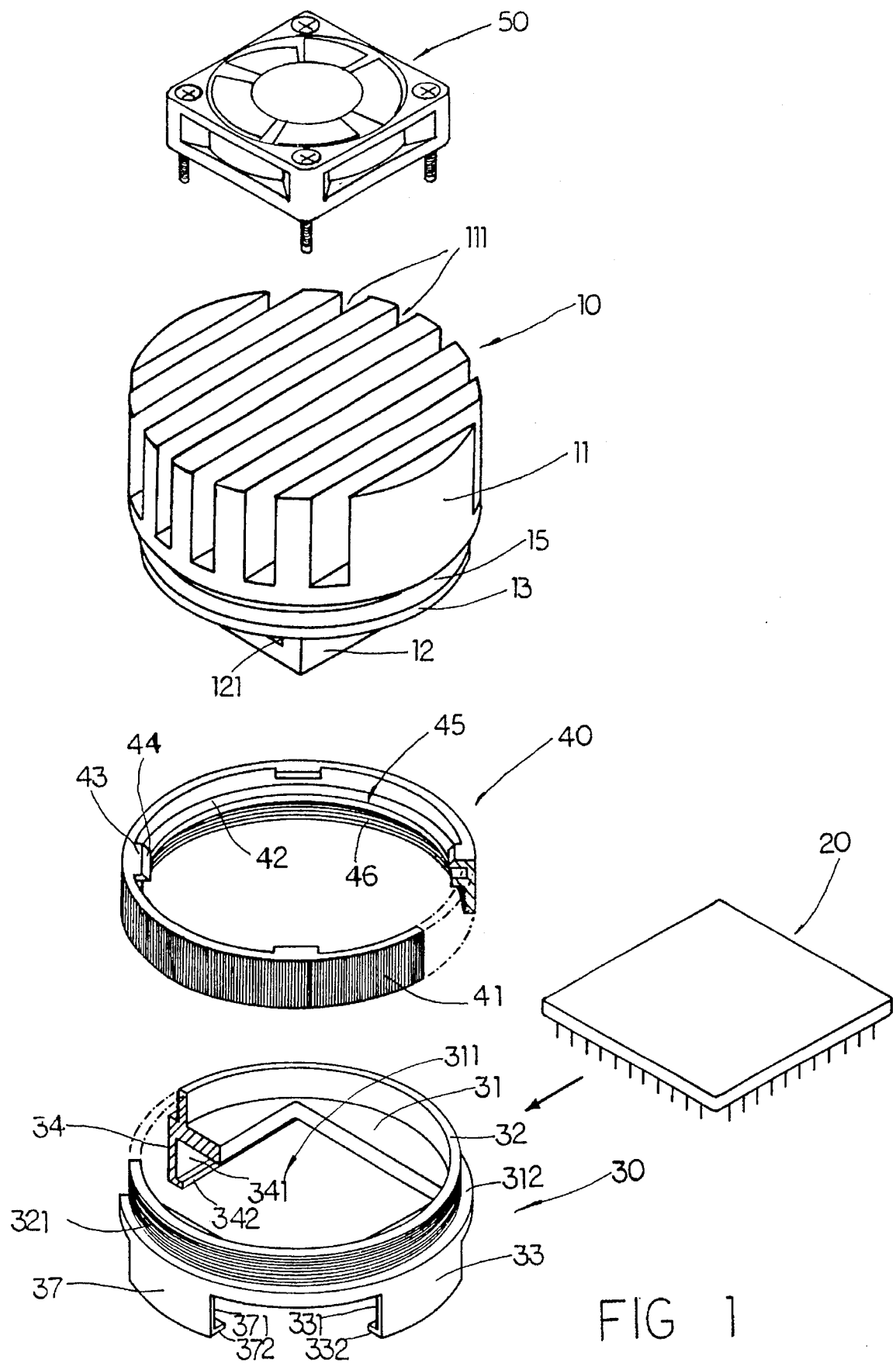
FIG. 1 is a partial sectional exploded perspective view of a heat sink arrangement for central processing unit according to a preferred embodiment of the present invention.
Figures 2, 3:
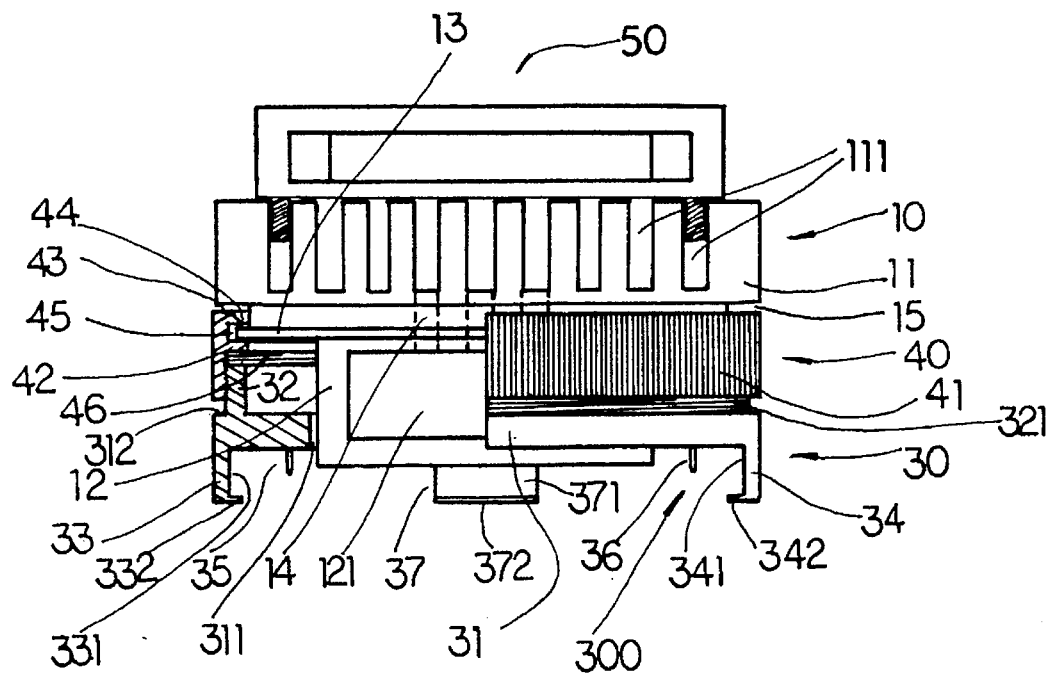
FIG. 2 is a partial sectional front view of a heat sink arrangement for central processing unit according to the above preferred embodiment of the present invention.
FIG. 3 is a sectional front view of a heat sink arrangement for central processing unit with a CPU installed according to the above preferred embodiment of the present invention.

Referring to FIGS. 1 to 3, a heat sink arrangement for central processing unit according to a preferred embodiment of the present invention is illustrated. The heat sink arrangement for securing a heat sink 10 to a central processing unit (CPU) 20 for dissipating of heat generated therefrom comprises a CPU housing 30 and a heat sink holding unit 40. The CPU housing 30, made of electrically insulating material such as nytron or delrin, comprises a circular frame 31 which forms a central square hole 311 thereon. The CPU housing 30 further integrally comprises an securing ring 32, which is extended upwardly and perpendicularly from a border fringe of a top surface of the circular frame 31 and has an outer diameter slightly smaller than an outer diameter of the frame 31 and longer than a diagonal line of the square hole 311, so as to form a circular shoulder 312 on a outer rim of the frame 31. The securing ring 32 forms an outer thread 321 on its outer periphery surface. The CPU housing 30 further comprises a holding means provided underneath the frame 31, which includes two opposite holding legs 33, 34 extended downwardly from two opposite side edges of the frame 31 for gripping the CPU housing 30 on the CPU. The two legs 33, 34 are parallel to two corresponding opposite sides of the square hole 311 respectively and each provides an inner vertical surface 331,341 and a bottom holding lip 332, 342 extending inwardly and horizontally respectively, wherein the distance between the two vertical surfaces 331,341 is equal to or slightly larger than the size of the CPU 20. Thus, the CPU housing 30 defines a cavity 300 between the two lips 33, 34 and a bottom surface of the frame 31 for receiving the CPU 20, in which two opposite marginal housing edge portions of the CPU 20 are supported by the holding lips 332, 342 respectively, as shown in FIG. 3.

In order to provide an urging force to hold the CPU 20 firmly in position, an urging means is provided at the bottom surface of the frame 31. As shown in FIG. 2, the urging means comprises two opposing protrusions 35, 36 protruded downwardly from two opposite sides, where the two legs 33, 34 located, of the bottom surface of the frame 31 respectively so as to lessen the thickness of the cavity 300, i.e. the distance between the free ends of the protrusions 35, 36 and the lips 332, 342, to equal to or slightly less than the thickness of the CPU 20. Thus, the CPU housing 30 can be firmly held in position on the CPU 20.

A stop leg 37, which has an inner vertical surface 371 and a bottom holding lip 372, is extended downwardly from the edge of the bottom surface of the frame 31 of the CPU housing 30 and is perpendicular to the two holding legs 33, 34, for limiting the inward motion of the CPU 20 so that the square hole 311 is aligned with the CPU 20.

The heat sink 10 of any body of metal or like material, which is designated to use in the present invention, comprises a cylindrical finned upper portion 11, a square lower portion 12 and a circular supporting rim 13 formed therebetween. The upper portion 11 forms a plurality of fins 111 for enlarging the heat dissipating surface area of the heat sink 10. The size of the square lower portion 12 of the heat sink 10 is equal to or slightly smaller than the size of the square hole 311 of the CPU housing 30 so as to adapt for inserting into the square hole 311 of the CPU housing 30 for urging upon a top surface of the CPU 20. The square lower portion 12 has a height larger than the height of the securing ring 32 plus the thickness of the frame 31 of said CPU housing 30 and has a transverse channel cavity 121 which is a rectangular through hole extending from one side to another opposite side of the square lower portion 12. The heat sink 10 further has a plurality of central axial airflow holes 14 which are longitudinally penetrated through from the finned upper portion 11 to the transverse channel cavity 121 of the square lower portion 12 for better air circulation. The cylindrical upper portion 11 has a diameter larger than the size of the square lower portion 12. The circular supporting rim 13 is protruded at the junction between the upper portion 11 and lower portion 12. According to the present preferred embodiment, for maximizing the heat dissipating effect of the heat sink 10, the diameter of the upper portion 11 is maximized to be larger than the supporting rim 13, and thus an indented circular groove 15 is formed adjacent and above the supporting rim 13 for enabling the engagement with the heat sink holding unit 40 described below.

The heat sink holding unit 40 is a circular ring having indentation 41 on its outer surface enabling easy rotating operation by operators. The thickness of a circular wall of the heat sink holding unit 40 is preferably equal to the thickness of the circular shoulder 312 of the CPU housing. The heat sink holding unit 40 protrudes a circular supporting ring 42 inwardly and radically from its central inner periphery surface, wherein a inner diameter of the supporting ring 42 should be smaller than an outer diameter of the supporting rim 13 of the heat sink 10. An upper portion of the holding unit 40 forms four confronting guard lips 43. Each confronting guard lip 43 has inclined end surface 44 protruded inwardly and horizontally from its tuner circular surface respectively. Therefore, a holding chamber 45 is defined between the four guard lips 43 and the supporting ring 42. The supporting rim 13 of the heat sink 10 can be pushed down into the holding chamber 45, i.e. disposing between the four guard lips 43 and the supporting ring 42, with the inclined surfaces 44 of the guard lips 43 acting as guiding surfaces, as shown in FIG. 2. The thickness of the supporting rim 13 should be equal to or slightly smaller than the distance between the upper surface of the supporting ring 42 and the bottom surfaces of the guard lips 43, so that the supporting rim 13 of the heat sink 10 can be held firmly in position therebetween. The heat sink holding unit 40 further provides an inner threaded circular surface 46 at its lower portion, i.e. positioning between the supporting ring 42 and a bottom end of the holding unit 40.

To improve the effectiveness of the heat sink 10 it is imperative to manage the airflow so as to maximize the amount of air that flows over the CPU or the surface area of the heat sink. It is known in the art that in the system, the airflow around the CPU can be increased by providing an additional fan. A fan 50 can be mounted on the upper portion 11 of the heat sink 10 to increase thermal dissipation of the heat sink.

Since there are a plurality of central axial airflow holes 14 provided to longitudinally extend through the upper portion 11 and the transverse channel cavity 121 of the lower portion 12, the airflow of the fan 50 is able to reach the lower portion 12 for performing better air circulation and enhancing the dissipation of heat from CPU.

In accordance with the disclosure above, the heat sink holding unit 40 with the specific heat sink 10 installed is connected with the CPU housing 30 by inserting the square lower portion 12 of the heat sink 10 into the square hole 311 of the housing 30 and screwing onto the securing ring 32. For instance, as shown in FIG. 2, the heat sink 10 is driven to move downward by the guard lips 43 of the heat sink holding unit 40 synchronically until its bottom surface remaining above the bottom ends of the protrusions 35, 36 of the housing 30, and thus the heat sink arrangement is assembled.

As shown in FIG. 3, the operator can slide the heat sink arrangement onto the CPU 20 with the holding legs 33, 34 holding the CPU 20 in position. In which, the CPU 20 is aligned with the square hole 311 when its toward motion is stopped by the stop leg 37 and the marginal edge portion of the CPU 20 is gripped between holding lips 332, 342 and the protrusions 35, 36.

For enabling intimate thermal coupling between the heat sink 10 and the CPU 20, the operator may then rotate the heat sink holding unit 40 to screw it further downward so as to drive the heat sink 10 further downward by an even downward pressing force applied through the four guard lips 43. When the bottom surface of the heat sink 10 is driven to in intimate thermal contact with the top surface of the CPU 20, the operator can feel a locking reaction force to stop further rotation of the holding unit 40. During the rotation of the heat sink holding unit 40 to urge the heat sink 10 upon the CPU 20 or to remove the heat sink 10 from the CPU 20, the heat sink 10 will not follow the rotation since its square lower portion 12 is locked by the square hole 311 of the housing 30 for preventing any scraping upon the CPU 20.

Since the shape of the CPU 20, such as Pentium Processor, is in square body shape, the maximum contact area will be achieved with a square bottom surface of the heat sink rather than any other shape, such as circular shape. Therefore, the square lower portion 12 of the heat sink 10 according to the present invention provides a maximum possible thermal contact area with the CPU 20 and thus maximizes the thermal coupling and thermal conduction performance. According to the arrangement of the present invention, the size of the square lower portion 12 of the heat sink 10 is able to enlarge to a maximum effective size, and thus the bottom surface area is maximized to 11.56 sq. cm, i.e. 3.4 cm×3.4 cm. It is nearly equal to the major heat generating central area, 12.25 sq. cm, of the CPU 20, for example a Pentium Processor, which results better intimate thermal conduction. Accordingly, 94% of the major heat generating central portion of the top surface of the CPU 20 is in thermal contact with the heat sink. Moreover, since the downward force is evenly applied to the outer periphery of the heat sink 10 through the guard lips 43, the urging force applied to the CPU 20 is evenly distributed to its top surface.

Although the invention has been disclosed above with regard to particular and preferred embodiment, these are advanced for illustrative purposes only and are not intended to limit the scope of this invention. It is to be understood, therefore, that various changes and modifications may be resorted to without departing from the spirit and scope of the invention as defined by the appended claims.

I claim:

1. A heat sink arrangement for central processing unit, comprising:
    a CPU housing which comprises a frame having a central square hole thereon, a securing ring, which is extended upwardly and perpendicularly from a border fringe of a top surface of said frame, having an inner size slightly larger than said central square hole and an outer thread provided on a periphery surface of said securing ring, and a holding means which is provided underneath said frame for firmly gripping said CPU housing on a CPU;
    a heat sink, which comprises a finned upper portion, a square lower portion having a transverse channel cavity, and a supporting rim formed between said finned upper portion and said square lower portion, wherein said square lower portion of said heat sink has a predetermined size adapted for inserting into said central square hole of said CPU housing and urging upon a top surface of said CPU, and that an outer diameter of said supporting rim is larger than said central square hole of said CPU housing, and that said heat sink further has at least an axial airflow hole penetrated longitudinally from said upper portion to said transverse channel cavity of said square lower portion; and
    a heat sink holding unit, which has a threaded circular lower portion adapted to screw onto said outer thread of said securing ring of said CPU housing, an upper portion having at least two opposite guard lips protruded inwardly and horizontally from an inner surface of said upper portion, and a supporting ring having an inner diameter smaller than said outer diameter of said supporting rim of said heat sink and being protruded inwardly between said upper and lower portions so as to define a holding chamber between said guard lips and said supporting ring, wherein said heat sink is firmly held in position by pushing said supporting rim of said heat sink down into said holding chamber for disposing said supporting rim of said heat sink between said guard lips and said supporting ring.

2. A heat sink arrangement for central processing unit as recited in claim 1 in which said heat sink holding unit is a circular ring which has four confronting guard lips protruded inwardly and horizontally from said inner surface of said upper portion of said heat sink holding unit.

3. A heat sink arrangement for central processing unit as recited in claim 2 in which each of said guard lips has an inclined end surface acting as a guiding surface when said supporting rim of said heat sink is pushed down into said holding chamber defined between said guard lips and said supporting ring for installing said heat sink to said heat sink holding unit.

4. A heat sink arrangement for central processing unit as recited in claim 2 in which said supporting ring is circular in shape and is protruded inwardly and radially from a central portion of said inner surface of said heat sink holding unit, and that said supporting rim of said heat sink is a circular rim having an outer diameter larger than said inner diameter of said supporting ring of said heat sink holding unit.

5. A heat sink arrangement for central processing unit as recited in claim 4 in which said upper portion of said heat sink is a cylindrical finned body having an outer diameter larger than the size of said square lower portion, and that said supporting rim of said heat sink is protruded at a junction between said upper portion and said lower portion.

6. A heat sink arrangement for central processing unit as recited in claim 5 in which the outer diameter of said upper portion of said heat sink is maximized to be larger than the outer diameter of said supporting rim, and that an indented circular groove is formed adjacent and above said supporting rim for engaging with said holding chamber of said heat sink holding unit.

7. A heat sink arrangement for central processing unit as recited in claim 1 in which said square lower portion of said heat sink has a height larger than a height of said securing ring plus a thickness of said frame of said CPU housing.

8. A heat sink arrangement for central processing unit as recited in claim 7 in which said securing ring of said CPU housing is a circular ring and said outer thread is disposed on said periphery surface of said securing ring for screwing engagement with said threaded circular lower portion of said heat sink holding unit which is disposed on an inner surface of said heat sink holding unit.

9. A heat sink arrangement for central processing unit as recited in claim 8 in which said heat sink holding unit has indentation on its outer surface.

10. A heat sink arrangement for central processing unit as recited in claim 9 in which said holding means of said CPU housing comprises two opposite holding legs extended downwardly from two opposite side edges of said frame of said CPU housing and being parallel to two corresponding opposite sides of said square hole respectively.

11. A heat sink arrangement for central processing unit as recited in claim 10 in which each of said holding legs has an inner vertical surface and a bottom holding lip extending inwardly and horizontally, wherein a cavity is defined between said two vertical surfaces, said two bottom holding lips and a bottom surface of said frame for receiving said CPU, in which two opposite marginal housing edge portions are supported by said two holding lips respectively.

12. A heat sink arrangement for central processing unit as recited in claim 11 in which said CPU housing further comprises at least two opposing protrusions protruded downwardly from two opposite sides, where said two holding legs are located, of the bottom surface of said frame respectively, so as to lessen a distance between two free ends of said two protrusions and said holding lips of said holding legs for firmly holding said CPU housing on said CPU.

13. A heat sink arrangement for central processing unit as recited in claim 12, in which said CPU housing further comprises a stop leg extended downwardly from an edge of the bottom surface of said frame and being perpendicular to said two holding legs, wherein said stop leg has an inner vertical surface and a bottom holding lip for limiting said CPU's inward motion so as to enable said square hole to be aligned with said CPU.

14. A heat sink arrangement for central processing unit as recited in claim 1, further comprising a fan installed on top of said heat sink.

15. A heat sink arrangement for central processing unit as recited in claim 1, in which said holding means comprises two opposite holding legs extended downwardly from two opposite side edges of said frame of said CPU respectively.

16. A heat sink arrangement for central processing unit as recited in claim 15, in which each of said holding legs has an inner vertical surface and a bottom holding lip extending inwardly and horizontally, wherein a cavity is defined between said two vertical surface, said two holding lips and a bottom surface of said frame for receiving said CPU, wherein two opposite marginal housing edge portions are supported by said two holding lips respectively.

17. A heat sink arrangement for central processing unit as recited in claim 16, in which said CPU housing further comprises at least two opposing protrusions protruded downwardly from two opposite sides, where said two holding legs are located, of the bottom surface of said frame respectively, so as to lessen a distance between of the free ends of said protrusions and said holding lips of said holding legs for firmly holding said CPU housing on said CPU.

18. A heat sink arrangement for central processing unit as recited in claim 17, in which said CPU housing further comprises a stop leg extended downwardly from an edge of the bottom surface of said frame and being perpendicular to said two holding legs, wherein said stop leg has an inner vertical surface and a bottom holding lip for limiting said CPU's inward motion so as to enable said central hole to be aligned with said CPU.

19. A heat sink arrangement for central processing unit as recited in claim 18, in which said securing ring of said CPU housing is a circular ring and said outer thread is disposed on said periphery surface of said securing ring for screwing engagement with said threaded circular lower portion of said heat sink holding unit.

\* \* \* \* \*